United States Patent
Homan

Patent Number: 6,154,512
Date of Patent: Nov. 28, 2000

[54] DIGITAL PHASE LOCK LOOP WITH CONTROL FOR ENABLING AND DISABLING SYNCHRONIZATION

[75] Inventor: Andrew Homan, Stittsville, Canada

[73] Assignee: Nortel Networks Corporation, Quebec, Canada

[21] Appl. No.: 09/196,460

[22] Filed: Nov. 19, 1998

[51] Int. Cl.[7] .................................................. H03D 3/24
[52] U.S. Cl. .......................... 375/376; 375/327; 327/150; 329/307
[58] Field of Search ................................... 375/376, 375, 375/374, 373, 327; 327/147, 150; 455/260; 329/307

[56] References Cited

U.S. PATENT DOCUMENTS

| | | | |
|---|---|---|---|
| 4,085,288 | 4/1978 | Viswanathan | 375/376 |
| 4,166,979 | 9/1979 | Waggener | 375/376 |
| 4,280,099 | 7/1981 | Rattlingourd | 327/160 |
| 4,972,444 | 11/1990 | Melrose et al. | 375/376 |
| 5,081,655 | 1/1992 | Long | 327/231 |
| 5,278,702 | 1/1994 | Wilson et al. | 360/51 |
| 5,398,263 | 3/1995 | Vanderspool, II et al. | 375/376 |
| 5,920,600 | 7/1999 | Yamaoka et al. | 375/376 |

*Primary Examiner*—Stephen Chin
*Assistant Examiner*—Lenny Jiang
*Attorney, Agent, or Firm*—Cobrin & Gittes

[57] ABSTRACT

The invention relates to methods and apparatus for synchronizing a local data clock with timing information from received data, during a fraction of a frame period. The apparatus includes a transition detect unit, a digital phase comparator, a phase regulator, and a control unit, for detecting the bit transitions of received data, determining the phase difference between timing information and a local data clock, advancing or retarding the local data clock, and enabling and disabling the synchronization in accordance with a predetermined rate.

6 Claims, 3 Drawing Sheets

DIGITAL PHASE LOCK LOOP WITH CONTROL FOR ENABLING AND DISABLING SYNCHRONIZATION

BACKGROUND OF THE INVENTION

Conventional wireless communications systems use bit clock recovery mechanisms to synchronize the data between wireless stations. In most instances the only timing information available is a sequence of transitions indicating the bit boundaries (i.e., the clock period). A Digital Phase Lock Loop (DPLL) is a component used in bit clock recovery mechanisms to make bit clock corrections (i.e., synchronize the locally generated clock) based on a comparison between the received data's timing derived from its transitions and that of a locally generated bit clock. FIG. 1 is a typical timing diagram of received data 10, its corresponding sliced data 20, and a locally generated bit clock 30 in a conventional wireless communications system. As FIG. 1 shows, once the locally generated bit clock is synchronized (locked) to the received data, the optimum data clocking points 60 (i.e. maximum value) of the received data can be used for communications.

If a transition occurs outside a pre-determined transition window 40, the local clock frequency is advanced or retarded by a fraction of the bit period depending on whether the transition was late or early, respectively. If the frequency is not continuously corrected, the local data clock will drift relative to the received data and synchronization will be lost. It is common in present wireless systems for synchronization to be lost due to a slip of half a bit. If the relative frequency difference is clearly understood, it is possible to disable the frequency corrections for a period of time and then enable them again, provided this period does not exceed the time to slip by half a bit. This time period can be approximated by:

$$(½)*(1/\text{Frequency Error})$$

For example, if the frequency error is 7.2 Hz, then the time period would be 69.44 ms.

DPLLs are susceptible to corrupt signals that will interfere with the signal locking process. Signal corruption is caused by jitter, noise, interference, multipath fading, or signal strength variations. Signal corruption causes the bit clock recovery mechanism to fail, causing loss of synchronization between the wireless terminal and the base station. In the case where the data consists of digitized voice samples, loss of synchronization manifests itself as a burst of noise at one or both ends of the communication link, depending on how audio muting has been implemented. In severe multi-path environments, loss of synchronization can occur as often as once per minute, which, depending on the wireless communication protocol, can cause a delay of several seconds before the voice path is restored again.

Over-correction occurs in DPLL circuits that have no means of changing the frequency correction rate. For example, if the maximum frequency correction is 1/32 bit for each bit then the corresponding frequency error is 31250 parts per million (ppm). For a DPLL in which the maximum frequency error is specified as 100 ppm (±50 ppm at each end of the wireless link) the DPLL is clearly prone to over-correct, especially when the input signal is badly corrupted due to the reasons stated above. Existing solutions have used receive signal strength and jitter as a measure of the input signal quality to enable and disable the frequency correction mechanism. By enabling and disabling the bit clock recovery mechanism, extraneous signals will be effectively blanked out during portions of the data frame. However, where the multipath effect is severe enough, this solution has not proved fast enough to prevent the bit clock recovery mechanism from failing and loss of synchronization from occurring. This is because where software is required to take this information and provide the enable/disable control signal to the hardware, it is not necessarily possible to disable the frequency correction mechanism fast enough before the DPLL has reacted to the input signal. Thus over-correction may already have taken place and loss of synchronization will occur.

Accordingly, there exists a need for systems and methods for synchronizing a local bit clock with a received bit clock that are not prone to over-corrections.

There also exists a need for systems and methods for synchronizing a local bit clock with a received bit clock that do not rely on signal quality measurements.

It is thus an object of the present invention to provide systems and methods for synchronizing a local bit clock with a received bit clock that do not rely on signal quality measurements.

SUMMARY OF THE INVENTION

In accordance with the teachings of the present invention, these and other objects may be accomplished by the present invention, which is a digital phase locked loop (DPLL) for synchronizing a local data clock with timing information from received data, during a fraction of a frame period.

The apparatus includes a transition detect unit for detecting the bit transitions of said received data. A digital phase comparator is electrically coupled to the transition detect unit for determining the phase difference between timing information from a received signal and a local data clock.

In addition, a phase regulator is electrically coupled to the digital phase comparator and the local clock source for advancing or retarding the local data clock. A control unit controls the enabling and disabling of the DPLL. The control unit controls the synchronizing in accordance with a predetermined rate, where the predetermined rate is a function of a predetermined disable period of time (Td), a predetermined enable period of time (Te), the local clock source (LCS), and the local data clock (LDC). The predetermined rate may also be defined by:

$$Td/Te$$

The maximum frequency is defined by:

$$1/N*(Td/Te)$$

where Td is a disable period of time, where Te is an enable period of time, and wherein N is in accordance with:

$$LCS/LDC$$

LCS is a bit rate of the local clock source and LDC is a bit rate of the local data clock. The result is the synchronization of the local data clock with timing information from received data, during a fraction of a frame period.

BRIEF DESCRIPTION OF THE DRAWINGS

The invention will be more clearly understood by reference to the following detailed description of an exemplary embodiment in conjunction with the accompanying drawings, in which.

DETAILED DESCRIPTION OF THE INVENTION

The present invention is a DPLL for synchronizing a local clock source with a received signal data signal including timing information, during a predetermined period. The invention can be used in wireless communication systems.

Figure 2:
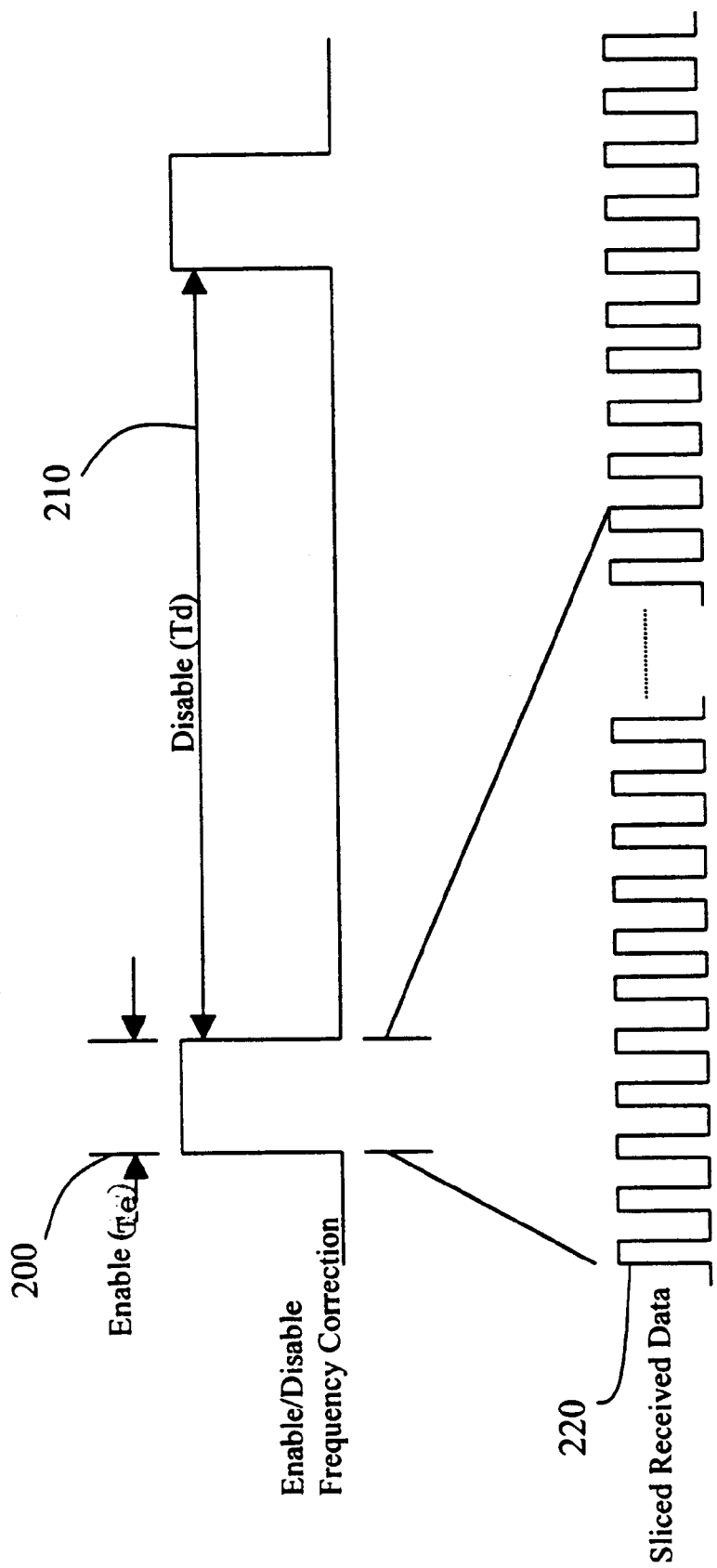
FIG. 2 is a timing diagram showing frequency correction enable/disable timing according to the present invention.

FIG. 2 is a diagram showing the enable period (Te) 200 and disable period (Td) 210 in accordance with the present invention. The relationship between the enable period 200 and the disable period 210 is a fixed relationship defined by: Td/Te. The maximum frequency correction is defined by:

$$1/N*(Td/Te)$$

where N is a nominal value for determining a local data clock. The value of N is determined by the bit rate of a local clock source and the desired local data clock, where:

$$N=(\text{local clock source})/(\text{local data clock})$$

For example, if the desired local data clock is 72 KHz and the local clock source is 2.304 MHZ, then N=2,304,000/72,000 =32.

In accordance with the invention, the maximum frequency correction is modified by the ratio Td to Te. For example, if Te is 0.25 ms and Td is 50 ms, the maximum frequency correction is:

$$1/N*(Td/Te) \text{ [bit for each bit]}$$

Thus, 1/32*(50/0.25)=1/6400 bit for each bit. This corresponds to a frequency error of 156.25 ppm. The frequency correction rate has been slowed down by a factor of Td/Te or 200:1, increasing the DPLL's immunity to multi-path fading, interference, noise, jitter, and the like.

Figure 3:
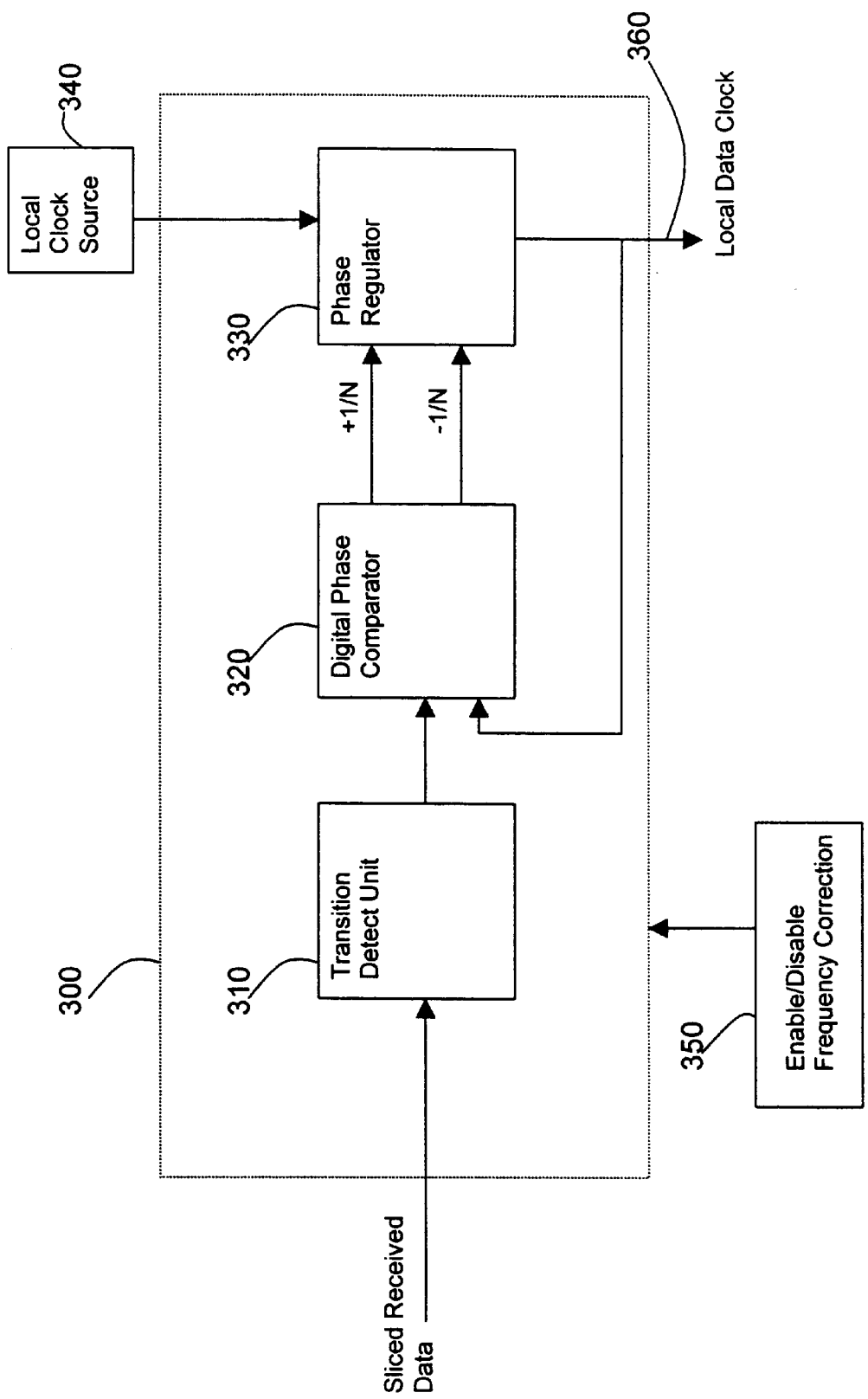
FIG. 3 is a diagram illustrating an embodiment of the digital phase lock loop for timing correction during a predetermined period in accordance with the present invention.

FIG. 3 shows a digital phase lock loop 300 with a control 350 for enabling and disabling frequency corrections during a predetermined period of time. Existing controls in the art are dependent on signal quality. The control in accordance with the present invention, however, is set to the predetermined rate (=1/N*(Td/Te)). Thus synchronization is no longer dependent on signal quality.

The preferred embodiment includes a transition detect unit 310 for detecting the transitions of the received data.

Figure 1:
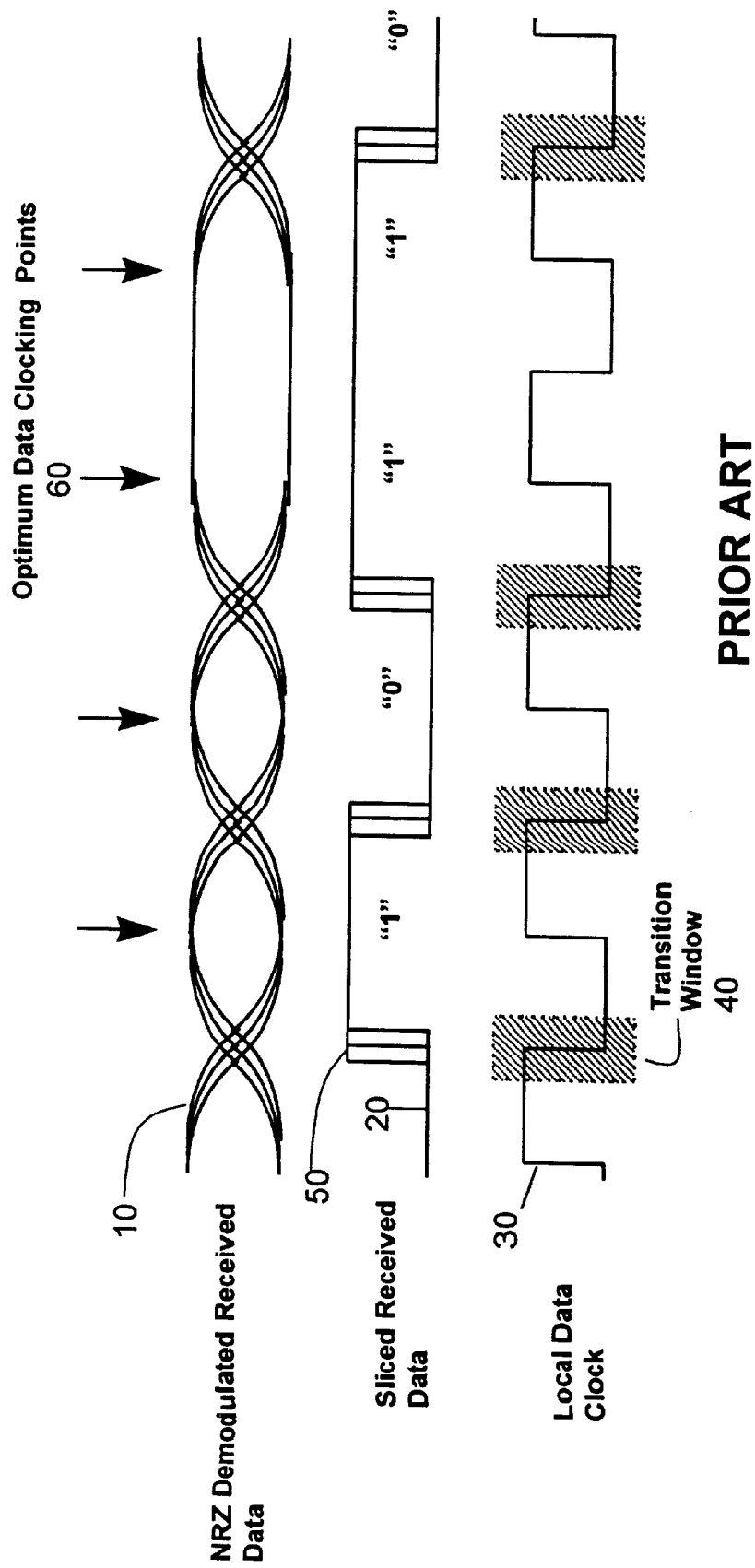
FIG. 1 is a timing diagram showing received and local data in accordance with prior art.

The transition detect unit generates an output from the bit transitions of the sliced data (FIG. 1, 50) which contains a frequency component at the bit rate.

The transition detect unit 310 output is fed into a digital phase comparator unit 320. The digital phase comparator unit 320 determines the phase difference between the received bit transitions and a local data clock 360 and generates a control signal for every bit transition that occurs outside the transition window (e.g. ±45° of its expected position).

The phase regulator unit 330 is a variable divider that divides the local clock source 340 by a nominal value of N to generate the local data clock 360. For every bit transition outside the transition window (FIG. 1, 40) the variable divider will divide by either N−1 or N+1, depending on the control signal from the digital phase comparator. This results in phase corrections to the local data clock in increments of 1/N bit to maintain lock with the received signal and ensure that the data is clocked at the optimum point in the received signal. For example, the local clock source=2.304 MHZ; N=32; therefore the local data clock=2.304 MHZ/32=72 KHz. The phase regulator will either divide by 31 or 33 for every bit transition outside the transition window.

The operations discussed herein can be implemented in a conventional microprocessor, software, Application Specific Integrated Circuit (ASIC), Programmable Array Logic (PAL), and the like, and still be within the scope of the present invention. In addition, the invention discussed herein can be backwards compatible with wireless communication systems already in existence since these systems also require bit clock synchronization and suffer from interference, multipath, noise, etc.

By implementing bit clock correction as described above, those skilled in the art will realize that since synchronization and signal locking will be less prone to over-correcting and false triggering, the effects of interference, multipath, noise, adjacent transmitters, and the like, will be substantially overcome. Thus, sampling the communications data will be at its maximum value.

In addition, those skilled in the art will realize that the invention described herein has a faster response time than conventional DPLLs utilized in wireless communication systems because signal quality is not used for determining when to synchronize the received and local bit clocks. It follows that communications will be less likely to be interrupted or suffer the effects of signal corruption.

It will thus be seen that the invention efficiently attains the objects set forth above, among those made apparent from the preceding description. In particular, the invention provides systems and methods of synchronizing a local data clock with timing information from received data, during a fraction of a frame period.

It will be understood that changes may be made in the above construction and in the foregoing sequences of operation without departing from the scope of the invention. It is accordingly intended that all matter contained in the above description or shown in the accompanying drawings be interpreted as illustrative rather than in a limiting sense.

It is also to be understood that the following claims are intended to cover all of the generic and specific features of the invention as described herein, and all statements of the scope of the invention which, as a matter of language, might be said to fall therebetween.

Having described the invention, what is claimed as new and secured by Letters Patent is:

1. A digital phase locked loop (DPLL) for synchronizing a local data clock with timing information from received data, during a fraction of a frame period, comprising:

a transition detect unit for detecting the bit transitions of said received data;

a digital phase comparator electrically coupled to said transition detect unit for determining the phase difference between said timing information and said local data clock;

a phase regulator electrically coupled to said digital phase comparator and a local clock source for advancing or retarding said local data clock; and a control unit for enabling and disabling said synchronizing in accordance with a predetermined rate, wherein said predetermined rate is a function of a predetermined disable period of time (Td), a predetermined enable period of time (Te), said local clock source (LCS), and said local data clock (LDC), thereby synchronizing said local data clock with timing information from received data, during a fraction of a frame period.

2. A digital phase locked loop according to claim 1, wherein said predetermined rate is:

$$1/N*(Td/Te)$$

wherein Td is said predetermined disable period of time, wherein Te is said predetermined enable period of time, wherein N is in accordance with:

$$LCS/LDC$$

wherein LCS is a bit rate of said local clock source and LDC is a bit rate of said local data clock.

3. An apparatus for synchronizing a local data clock with timing information from received data, during a fraction of a frame period, comprising:

transition detect means for detecting the bit transitions of said received data;

digital phase comparator means electrically coupled to said transition detect means for determining the phase difference between said timing information and said local data clock;

phase regulator means electrically coupled to said digital phase comparator means and a local clock source for advancing or retarding said local data clock; and control means for enabling and disabling a synchronizing in accordance with a predetermined rate, wherein said predetermined rate is a function of a predetermined disable period of time (Td), a predetermined enable period of time (Te), said local clock source (LCS), and said local data clock (LDC), thereby synchronizing said local data clock with timing information from received data, during a fraction of a frame period.

4. An apparatus according to claim 3, wherein said predetermined rate is:

$$1/N*(Td/Te)$$

wherein Td is said predetermined disable period of time, wherein Te is said predetermined enable period of time, wherein N is in accordance with:

$$LCS/LDC$$

wherein LCS is a bit rate of said local clock source and LDC is a bit rate of said local data clock.

5. A method of synchronizing a local data clock with timing information from received data, during a fraction of a frame period, comprising:

detecting the bit transitions of said received data;

determining the phase difference between said timing information and said local data clock;

advancing or retarding said local data clock; and enabling and disabling said synchronizing in accordance with a predetermined rate, wherein said predetermined rate is a function of a predetermined disable period of time (Td), a predetermined enable period of time (Te), a local clock source (LCS), and said local data clock (LDC), thereby synchronizing said local data clock with timing information from received data, during a fraction of a frame period.

6. A method according to claim 5, wherein said predetermined rate is:

$$1/N*(Td/Te)$$

wherein Td is said predetermined disable period of time, wherein Te is said predetermined enable period of time, wherein N is in accordance with:

$$LCS/LDC$$

wherein LCS is a bit rate of said local clock source and LDC is a bit rate of said local data clock.

* * * * *